US012785743B2

(12) United States Patent
Luther et al.

(10) Patent No.: US 12,785,743 B2
(45) Date of Patent: Nov. 3, 2026

(54) RF DEVICE WITH FIR ASIC FILTER AND RELATED METHODS

(71) Applicant: Eagle Technology, LLC, Melbourne, FL (US)

(72) Inventors: Justin Jody Luther, Melbourne, FL (US); Alan W. Mast, Melbourne Beach, FL (US); Kevin Arter, Palm Bay, FL (US); Stephen B. Brown, Palm Bay, FL (US); Daniel A. Robison, West Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 33 days.

(21) Appl. No.: 18/785,376

(22) Filed: Jul. 26, 2024

(65) Prior Publication Data

US 2026/0031843 A1 Jan. 29, 2026

(51) Int. Cl.

| | |
|---|---|
| ***H04B 1/12*** | (2006.01) |
| ***H03H 17/02*** | (2006.01) |
| *H03H 17/00* | (2006.01) |

(52) U.S. Cl.

CPC ............. *H04B 1/123* (2013.01); *H03H 17/02* (2013.01); *H03H 2017/0081* (2013.01); *H03H 2017/009* (2013.01)

(58) Field of Classification Search

CPC .................. H04B 1/123; H03H 17/02; H03H 2017/0081; H03H 2017/009

See application file for complete search history.

(56) References Cited

U.S. PATENT DOCUMENTS

| | | | | |
|---|---|---|---|---|
| 8,213,467 B2 | 7/2012 | Little et al. | | |
| 10,917,163 B2 | 2/2021 | Rutt et al. | | |
| 11,711,139 B2 | 7/2023 | Rutt et al. | | |
| 2007/0112901 A1 | 5/2007 | Niktash et al. | | |
| 2009/0115650 A1* | 5/2009 | Tietjen | H04B 1/0007 | 341/155 |
| 2014/0002284 A1* | 1/2014 | Tan | H03M 1/1052 | 341/118 |
| 2015/0244387 A1* | 8/2015 | Fleishman | H03M 1/201 | 341/131 |
| 2016/0218759 A1 | 7/2016 | Robey et al. | | |
| 2023/0239023 A1* | 7/2023 | Kiesel | H04B 7/086 | 370/329 |

(Continued)

OTHER PUBLICATIONS

Park et al. "Design and Implementation of a Digital Front-End With Digital Compensation for Low-Complexity 4G Radio Transceivers" Digital Object Identifier 10.1109/ACCESS .2021.3102949 Aug. 6, 2021 pp. 24.

(Continued)

*Primary Examiner* — Dac V Ha

(74) *Attorney, Agent, or Firm* — ALLEN, DYER, DOPPELT, + GILCHRIST, P.A.

(57) ABSTRACT

An RF device may include an RF antenna, and an ASIC downstream from the RF antenna. The ASIC may include ADCs configured to generate replica digitized input signals, and DSP cores downstream from the ADCs. Each DSP core may have complex coefficient multipliers and associated delay circuits, and a respective summer downstream from each DSP core. The RF device may also include a processor configured to control the complex coefficient multipliers and associated delay circuits.

22 Claims, 7 Drawing Sheets

(56) References Cited

U.S. PATENT DOCUMENTS

2024/0413831 A1* 12/2024 Lok ..................... H03M 1/1255

OTHER PUBLICATIONS

LNX Corp. "A Mixed-signal ASIC for Digital RF Memory Applications" https://www.microwavejournal.com/articles/1555-a-mixed-signal-asic-for-digital-rf-memory-applications Dec. 1, 2004 pp. 3.
U.S. Appl. No. 18/785,345, filed Jul. 26, 2024 Luther et al.

* cited by examiner

RF DEVICE WITH FIR ASIC FILTER AND RELATED METHODS

TECHNICAL FIELD

The present invention relates to the field of digital signal processing (DSP), and, more particularly, to radio frequency (RF) signal processing and related methods.

BACKGROUND

The typical communications transmitter comprises a signal generator, for example, a processor, for providing a low power input signal to be transmitted. The transmitter may also include a power amplifier coupled to the signal generator, and an antenna coupled to an output of the power amplifier. The power amplifier amplifies the power of the input signal from the signal generator for transmission via the antenna.

In an ideal implementation, the power amplifier is a linear device, i.e. the power amplifier produces an amplified replica of the low power electrical signal. In other words, the amplified signal may have identical phase and frequency characteristics to the input signal. Nonetheless, the typical power amplifier may be nonlinear. The power amplifier produces an amplified signal that may have distinctive phase and frequency characteristics compared to the input signal, i.e. the amplified signal is distorted. To address this nonlinear issue, some transmitter devices may predistort the signal to be transmitted.

Once the signal is transmitted, it may be subject to additional distortion due to external interference and other factors. Signal distortion occurs when the shape, amplitude, phase, or timing of an electrical signal changes as it passes through the circuit (e.g., the power amplifier noted above) or the transmission medium. This can happen due to a variety of factors, including the transmission medium's characteristics, the distance and bandwidth of the signal, and the presence of other signals or noise sources.

When the signal is received, the receiver device includes a typical RF receiving chain, which includes one or more filters. The filters may remove some of the distortion/interference introduced into the signal. For example, the source of the distortion in the receive signal may comprise thermal noise, other emitting systems in the same frequency band, and even frequency shifted copies of the desired signal.

In typical approaches, the transmitter device or receiver device may comprise one or more Field Programmable Gate Array (FPGA) circuits for providing the filtering and other processing. Although FPGA approaches are flexible, they may not provide a desirable Size Weight and Power (SWaP). For example, the FPGA circuit 100 shown in FIG. 1 provides a finite impulse response (FIR) and an infinite impulse response (IIR) filter. Here, the filter banks are passband decimation filters.

SUMMARY

Generally, an RF device may comprise an RF antenna, and an application-specific integrated circuit (ASIC), for example, an FIR filter circuit, downstream from the RF antenna. The ASIC may include a plurality of analog-to-digital converters (ADCs) configured to generate a plurality of replica digitized input signals, and a plurality of digital signal processing (DSP) cores downstream from the plurality of ADCs. Each DSP core may comprise a plurality of complex coefficient multipliers and associated delay circuits, and a respective summer downstream from each DSP core. The RF device also may include a processor configured to control the plurality of complex coefficient multipliers and associated delay circuits.

More specifically, each DSP core may comprise a plurality of band pass filters respectively coupled to the plurality of complex coefficient multipliers. The processor may be configured to generate coefficients for the plurality of complex coefficient multipliers, delay values for the associated delay circuits, and passband parameters for the plurality of band pass filters.

In some embodiments, the RF device may include a plurality of power divider circuits external from the ASIC and coupled upstream of the plurality of ADCs and configured to generate a plurality of replica analog input signals respectively for the plurality of ADCs. The RF device may comprise at least one other ASIC coupled to the processor. The processor may be external from the ASIC. The processor may be configured to selectively enable one or more of the plurality of DSP cores. The plurality of DSP cores may be coupled in parallel to the plurality of ADCs.

Another aspect is directed to an electronic device that may comprise a FIR ASIC filter to be coupled to RF circuitry. The FIR ASIC filter may comprise a plurality of ADCs configured to generate a plurality of replica digitized input signals, and a plurality of DSP cores downstream from the plurality of ADCs. Each DSP core may comprise a plurality of complex coefficient multipliers and associated delay circuits, and a respective summer downstream from each DSP core. The electronic device may comprise a processor configured to control the plurality of complex coefficient multipliers and associated delay circuits.

Yet another aspect is directed to a method for making an RF device to be coupled to an RF antenna. The method may comprise forming an ASIC to be coupled downstream from the RF antenna and comprising a plurality of ADCs configured to generate a plurality of replica digitized input signals, and a plurality of DSP cores downstream from the plurality of ADCs. Each DSP core may comprise a plurality of complex coefficient multipliers and associated delay circuits. The ASIC may include a respective summer downstream from each DSP core. The method may further comprise coupling a processor to the ASIC to control the plurality of complex coefficient multipliers and associated delay circuits.

DETAILED DESCRIPTION

Figure 1:
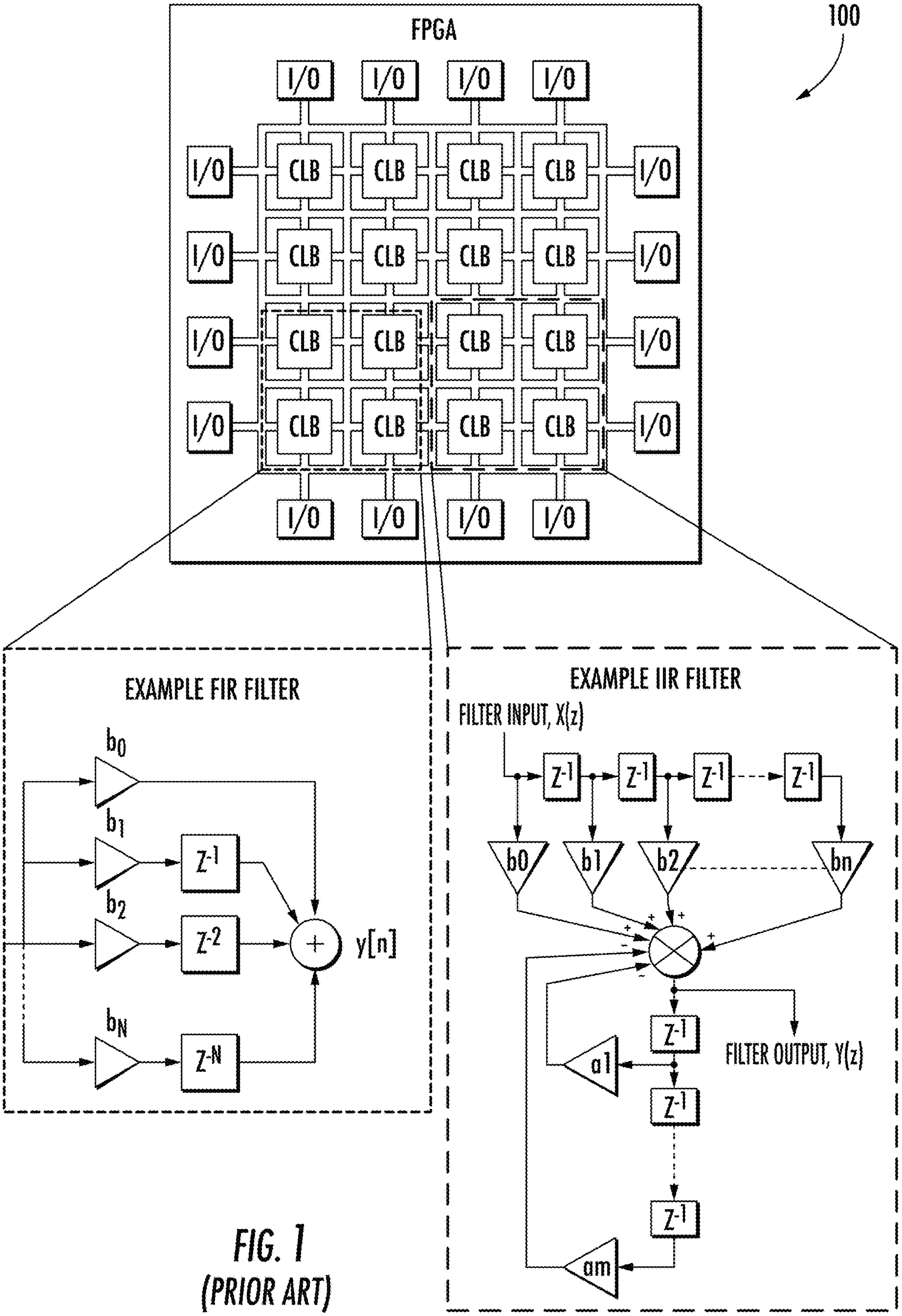
FIG. 1 (PRIOR ART)
FIG. 1 is a schematic diagram of a filter circuit, according to the prior art.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

In typical approaches for digital filtering, the requirements of the application may use multiple stages of signal conditioning and detection. To maintain the flexibility of the filtering characteristics, this may require the use of FPGA devices, which have high SWAP costs. Further, this may require carrying analog RF signals or wideband digital representations of the signal deeper into the system, which may increase the complexity and power dissipation throughout the system. Also, these FPGA approaches may require significant interface constraints on the input and output formats of the digital samples, for example, bit rate and parallelization.

In the following, an approach to address these drawbacks of the prior art is disclosed, particularly with regards to the receive chain in RF processing. In particular, this approach may perform a plurality of digital filter types closer to the aperture of the system. Here, the incoming analog RF signal is digitized using one or more ADCs prior to decimation filtering and brought down to baseband. Vector modulation is independently applied to the digitized RF and played back through a DAC or summed with other delayed samples in the beamformer network. Delays and coefficient weights are applied to copies of the input RF signal before being summed and sent out either as analog RF or as digital IQ samples at variable sample rates.

Figure 2A:
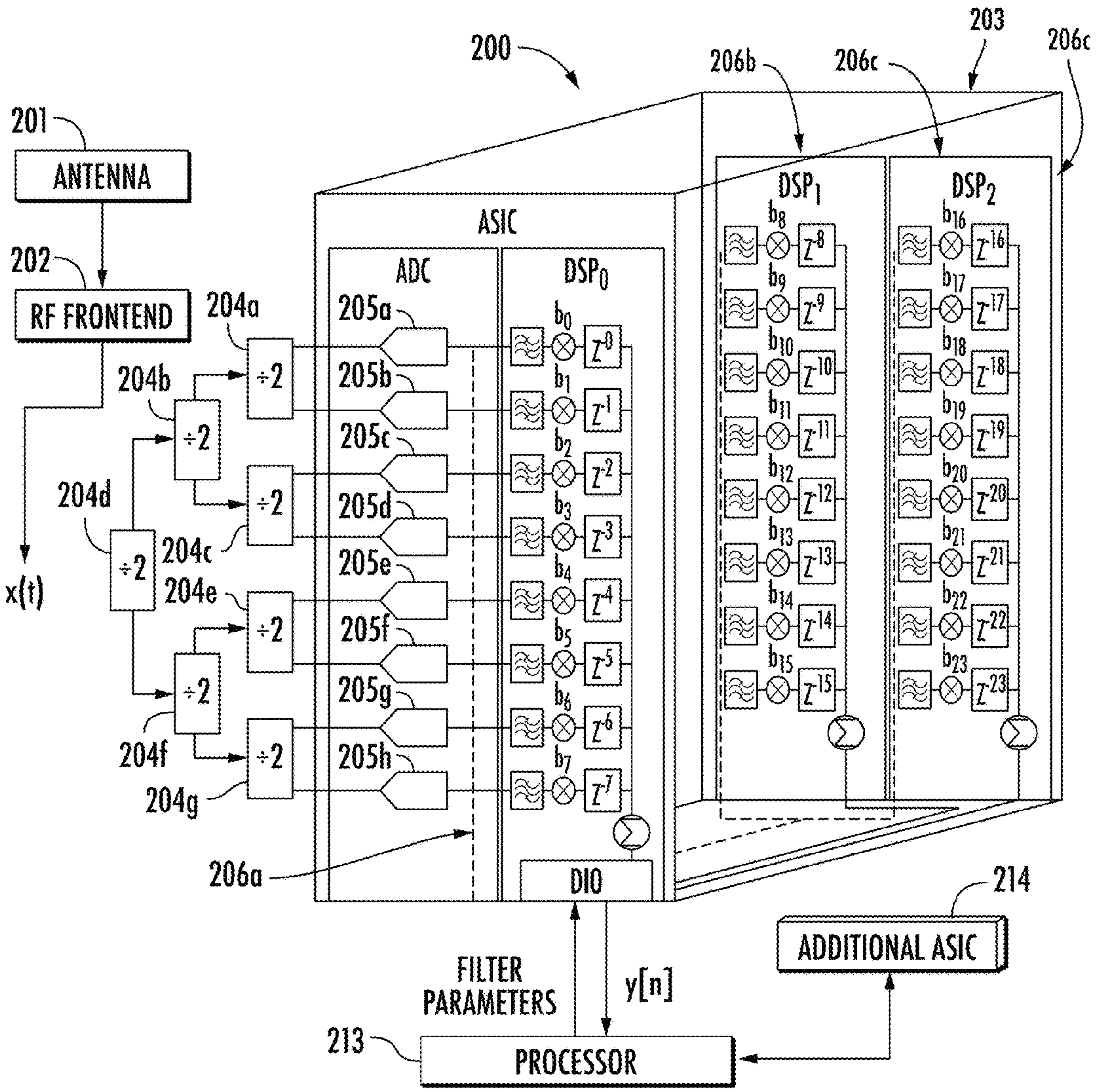
FIG. 2A is a schematic diagram of an RF device with a FIR filter circuit, according to a first embodiment of the present disclosure.
Figure 2B:
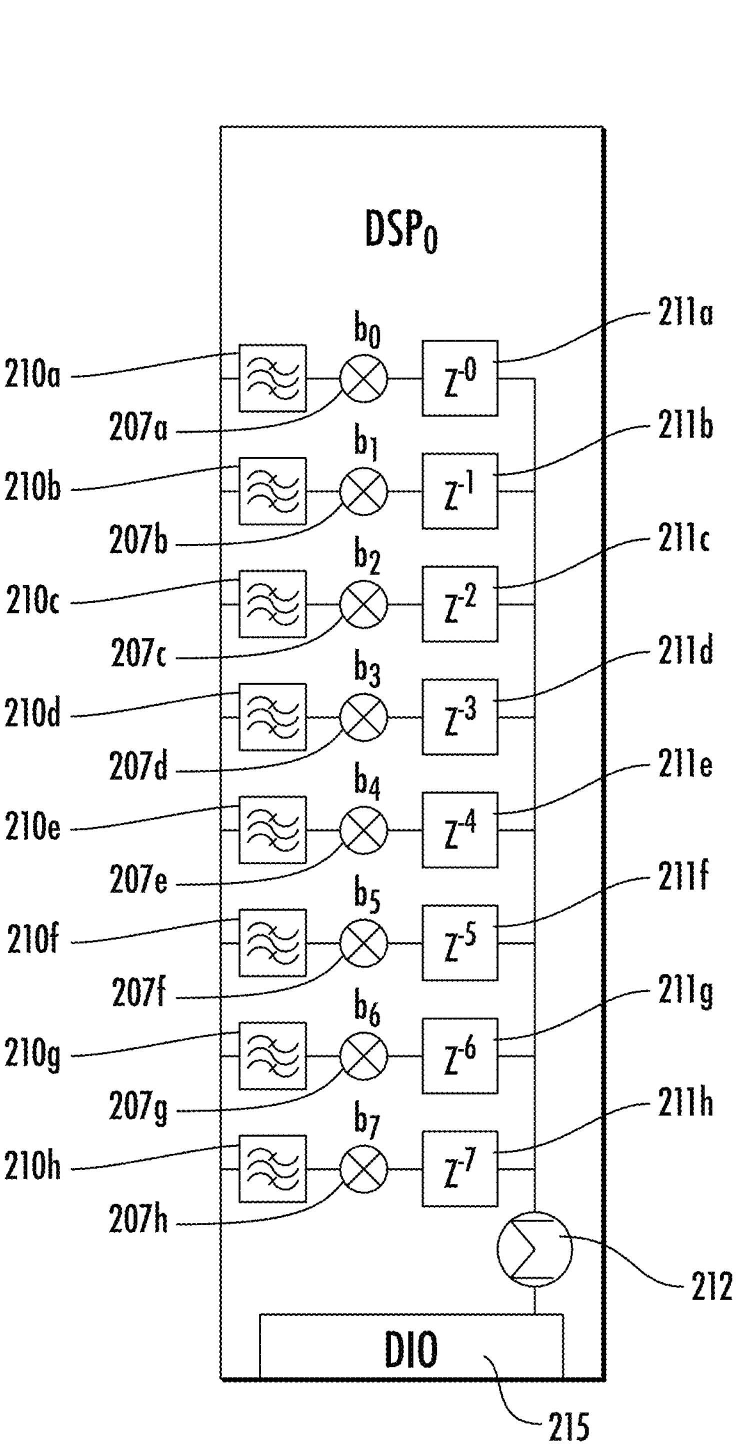
FIG. 2B is a schematic diagram of the DSP core from the RF device of FIG. 2A.

Referring now to FIGS. 2A-2B, an RF device 200 according to the present disclosure is now described. The RF device 200 illustratively includes an RF antenna 201 configured to generate an RF receive signal, and an RF frontend 202 downstream from the RF antenna and configured to process the RF receive signal. For example, the RF frontend 202 may comprise one or more of amplifiers, and mixers, etc., as will be appreciated by those skilled in the art. Also, downstream from the RF frontend 202, there be may some digital components, such as a decimator, for example.

The RF device 200 includes an ASIC 203 downstream from the RF antenna 201. In the illustrated example, the ASIC 203 comprises a FIR filter circuit. The RF device 200 illustratively comprises a plurality of power divider circuits 204*a*-204*g* external from the ASIC 203 and coupled downstream from the RF frontend 202 and configured to receive an input signal x(t) from the RF frontend. The plurality of power divider circuits 204*a*-204*g* is configured to generate a plurality of replica analog input signals.

The ASIC 203 illustratively comprises a plurality of ADCs 205*a*-205*h* coupled downstream of the plurality of power divider circuits 204*a*-204*g* and respectively receiving the plurality of replica analog input signals. The plurality of ADCs 205*a*-205*h* is configured to generate a plurality of replica digitized input signals.

The ASIC 203 illustratively comprises a plurality of DSP cores 206*a*-206*c* (i.e., DSP cores) downstream from the plurality of ADCs 205*a*-205*h* and coupled in parallel to the plurality of ADCs. It should be appreciated that although the plurality of DSP cores 206*a*-206*c* illustratively includes only three DSP cores, the number of DSP cores may vary depending on the application.

Each of the plurality of DSP cores 206*a*-206*c* comprises a plurality of complex coefficient multipliers 207*a*-207*h* (i.e., for vector modulation), a plurality of band pass filters 210*a*-210*h* respectively coupled upstream to the plurality of complex coefficient multipliers, and associated delay circuits 211*a*-211*h* coupled downstream from the plurality of complex coefficient multipliers.

The ASIC 203 illustratively comprises respective summers 212*a*-212*c* coupled downstream from the plurality of DSP cores 206*a*-206*c*. The RF device 200 also includes a processor 213 configured to control the plurality of complex coefficient multipliers 207*a*-207*h*, the plurality of band pass filters 210*a*-210*h*, and the associated delay circuits 211*a*-211*h*. In particular, the processor 213 is configured to generate coefficients (e.g., bilinear coefficients) for the plurality of complex coefficient multipliers 207*a*-207*h*, delay values for the associated delay circuits 211*a*-211*h*, and passband parameters for the plurality of band pass filters 210*a*-210*h* (i.e., passband frequency range, center frequency of passband, passband ripple). In some embodiments, the processor 213 may be configured to transmit a digital word/bit string for the coefficients, the delay values, and the passband parameters.

The RF device 200 illustratively includes an additional ASIC 214 coupled to the processor 213. In some embodiments, the additional ASIC 214 may comprise a replica of the ASIC 203 (e.g., FIGS. 3A and 3b). Of course, the additional ASIC 214 may comprise a plurality thereof in some embodiments.

Further, in the illustrated example, the processor 213 is external from the ASIC 203. In other embodiments, the processor 213 may be integrated within the ASIC 203.

The processor 213 is configured to selectively enable one or more of the plurality of DSP cores 206*a*-206*c*, and/or the plurality of ADCs 205*a*-205*h*. Also, the processor 213 may be configured to provide different coefficients for the plurality of complex coefficient multipliers 207*a*-207*h*, different delay values for the associated delay circuits 211*a*-211*h*, and different passband parameters for the plurality of band pass filters 210*a*-210*h* for each of the plurality of DSP cores 206*a*-206*c*.

Helpfully, this permits the RF device 200 to scale resources up and down to the needed application. In other words, the RF device 200 provides greater flexibility than typical ASIC approaches. In this embodiment, the processor 213 is coupled to the ASIC 203 via a Serializer/Deserializer (SerDes) module 215.

Another aspect is directed to an electronic device 200 comprising a FIR ASIC filter 203 to be coupled to RF circuitry 201, 202. The FIR ASIC filter 203 comprises a plurality of ADCs 205*a*-205*h* configured to generate a plurality of replica digitized input signals, and a plurality of DSP cores 206*a*-206*c* downstream from the plurality of ADCs. Each DSP core 206*a*-206*c* comprises a plurality of complex coefficient multipliers 207*a*-207*h* and associated delay circuits 211*a*-211*h*, and a respective summer 212*a*-212*c* downstream from each DSP core. The electronic device 200 comprises a processor 213 configured to control the plurality of complex coefficient multipliers 207*a*-207*h* and associated delay circuits 211*a*-211*h*.

Yet another aspect is directed to a method for making an RF device 200 to be coupled to an RF antenna 201. The method comprises forming an ASIC 203 to be coupled downstream from the RF antenna 201 and comprising a plurality of ADCs 205*a*-205*h* configured to generate a plurality of replica digitized input signals, and a plurality of DSP cores 206*a*-206*c* downstream from the plurality of ADCs. Each DSP core 206*a*-206*c* comprises a plurality of complex coefficient multipliers 207*a*-207*h* and associated delay circuits 211*a*-211*h*. The ASIC 203 includes a respective summer 212*a*-212*c* downstream from each DSP core 206*a*-206*c*. The method further comprises coupling a processor 213 to control the plurality of complex coefficient multipliers 207*a*-207*h* and associated delay circuits 211*a*-211*h*.

Figure 3A:
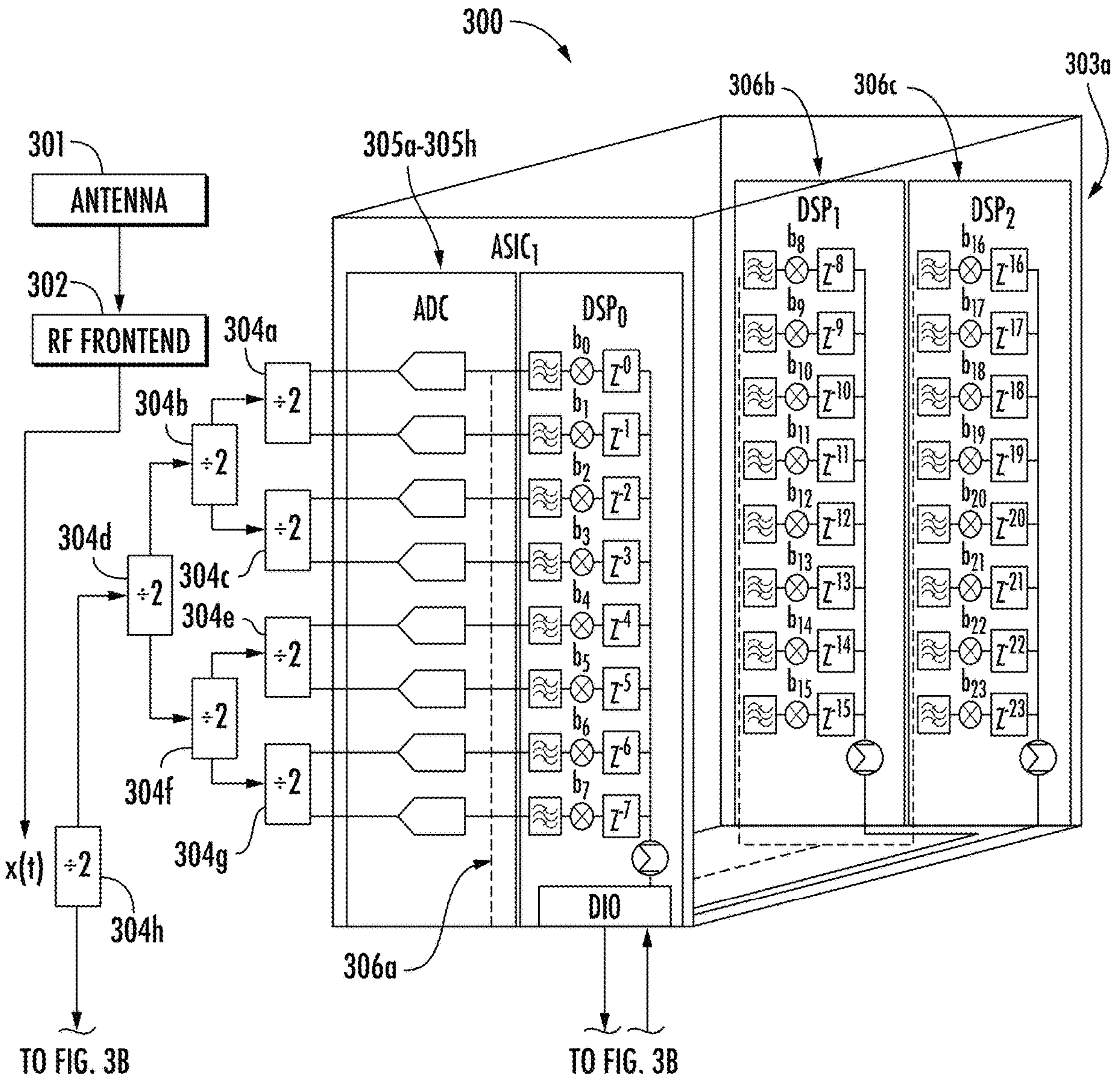
FIGS. 3A and 3B are a schematic diagram of an RF device with a FIR filter circuit, according to a second embodiment of the present disclosure.
Figure 3B:
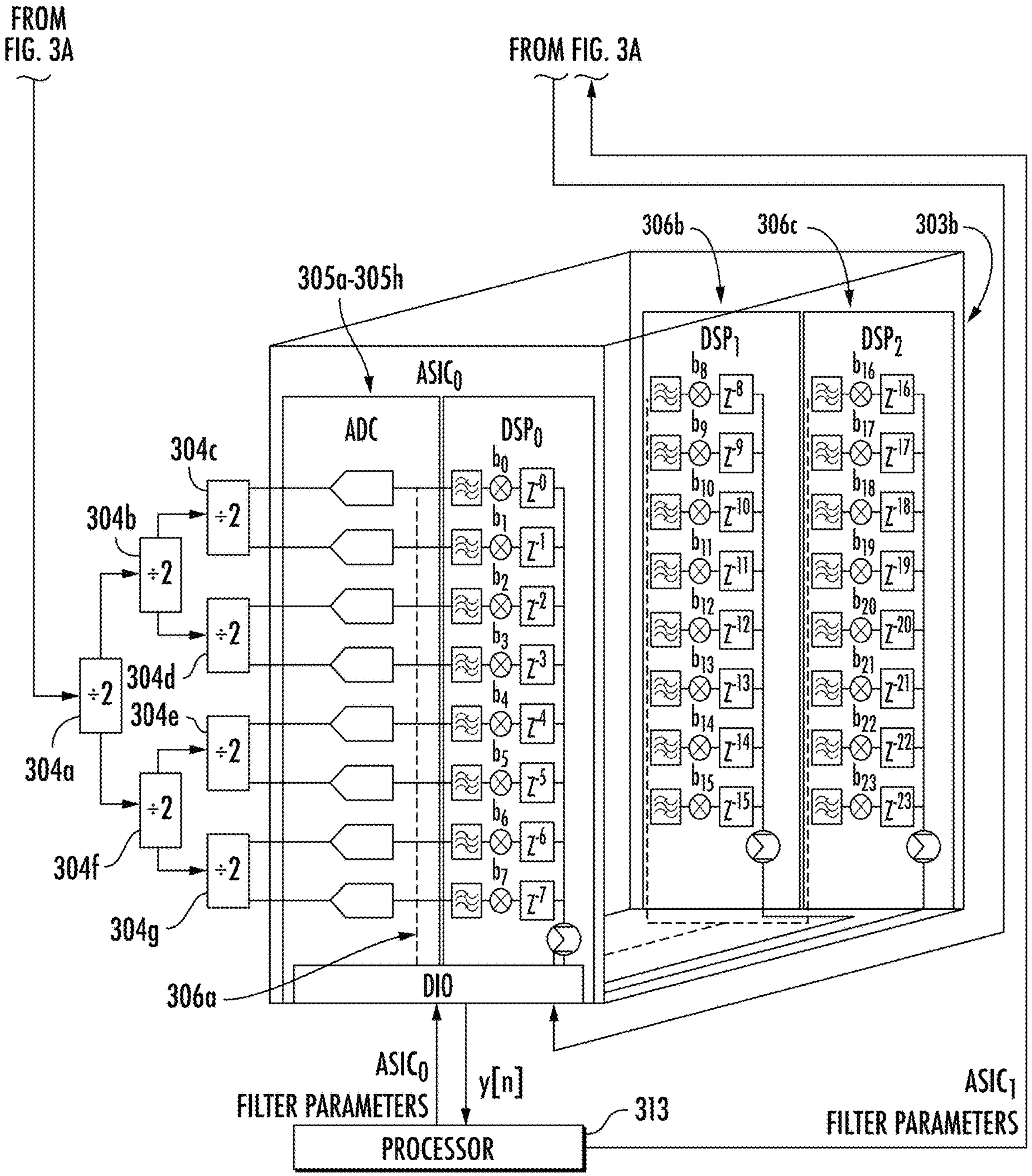

Referring now additionally to FIGS. 3A and 3B, another embodiment of the RF device 300 is now described. In this embodiment of the RF device 300, those elements already discussed above with respect to FIGS. 2A-2B are incremented by 100 and most require no further discussion herein. This embodiment differs from the previous embodiment in that this RF device 300 illustratively includes first and second FIR filter ASICs 303*a*-303*b* coupled in parallel, and additional power divider circuits 304*a*-304*g*, 304*h*.

Figure 4A:
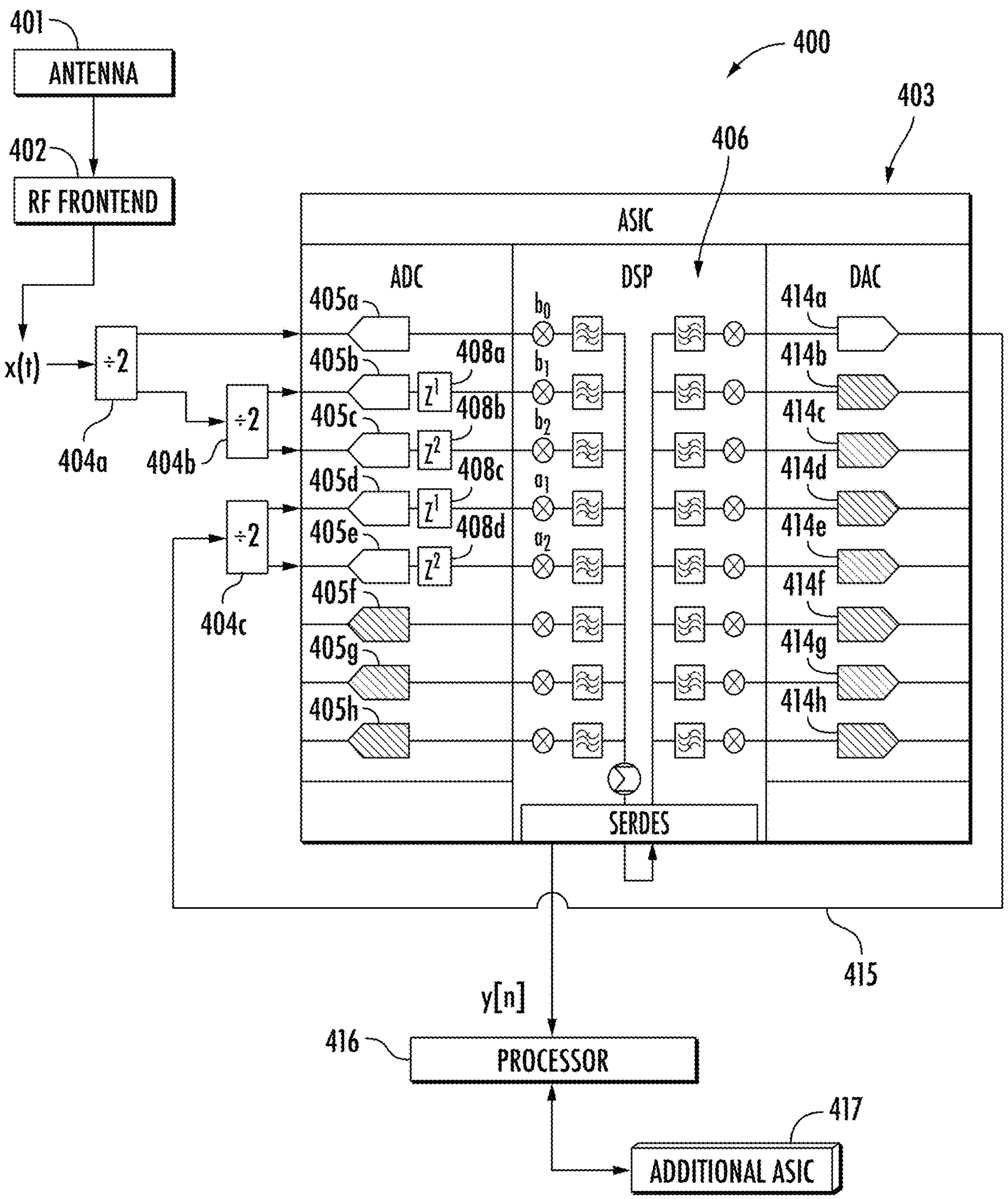
FIG. 4A is a schematic diagram of an RF device with an IIR filter circuit, according to a first embodiment of the present disclosure.
Figure 4B:
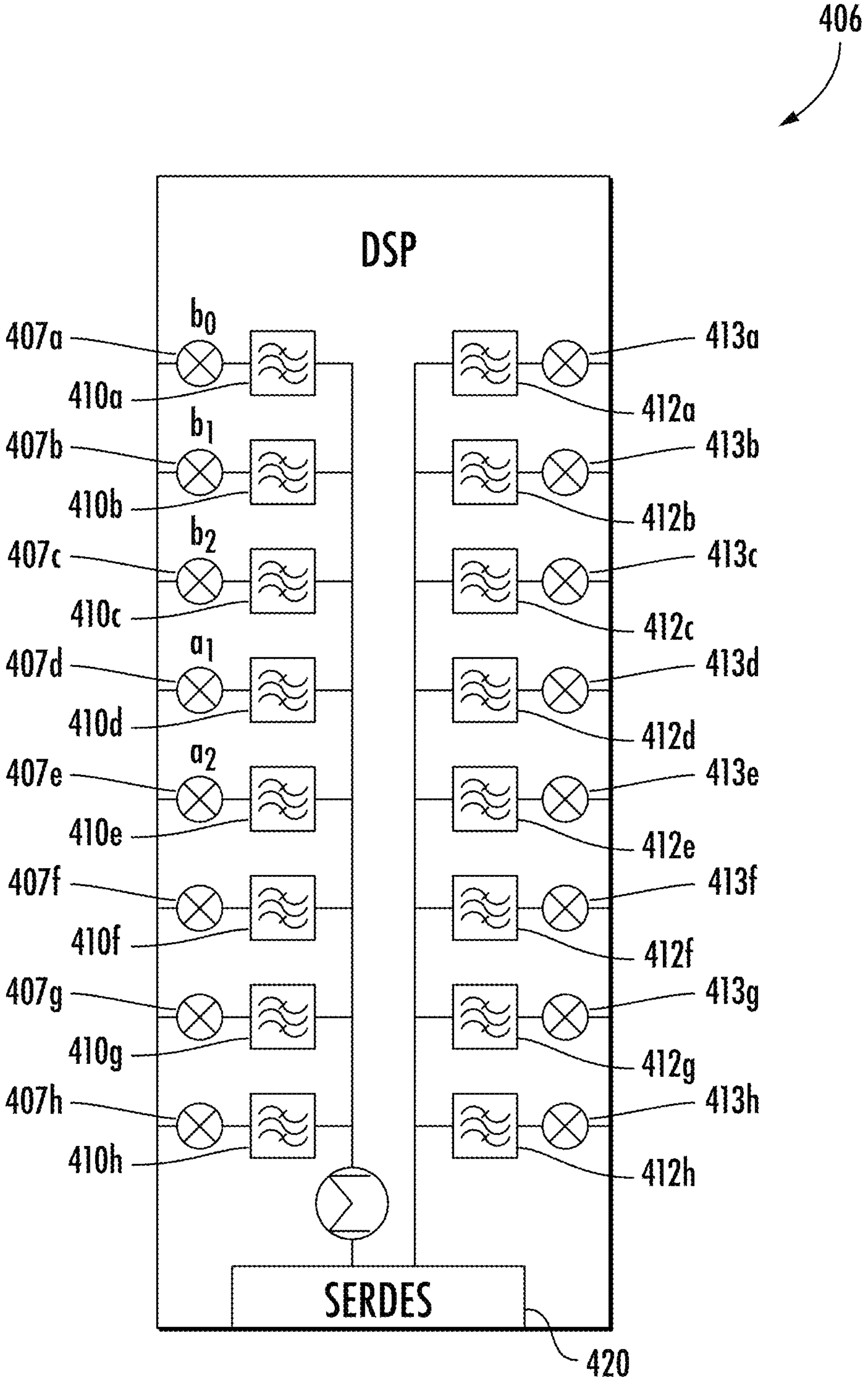
FIG. 4B is a schematic diagram of the DSP core from the RF device of FIG. 4A.

Referring now to FIGS. 4A-4B, another embodiment of an RF device 400 is now described. As will be appreciated, this structure serves as the DSP core of the RF device 400. The RF device 400 includes an RF antenna 401, an RF front end 402 downstream from the RF antenna, and an ASIC 403 downstream from the RF antenna. In the illustrated example, the ASIC 403 comprises an IIR filter circuit.

The RF device 400 illustratively comprises a plurality of power divider circuits 404*a*-404*c* external from the ASIC 403 and coupled downstream from the RF frontend 402 and configured to receive an input signal x(t) from the RF frontend. The plurality of power divider circuits 404*a*-404*c* is configured to generate a plurality of replica analog input signals.

The ASIC 403 comprises a plurality of ADCs 405*a*-405*h* coupled downstream of the plurality of power divider circuits 404*a*-404*c* and respectively receiving the plurality of replica analog input signals. The plurality of ADCs 405*a*-405*h* is configured to generate a plurality of replica digitized input signals.

The ASIC 403 illustratively comprises associated delays 408*a*-408*d* downstream from the plurality of ADCs 405*a*-405*h*, and a DSP core 406 (i.e., a filter bank) downstream from the plurality of ADCs 405*a*-405*h*. The DSP core 406 illustratively comprises a first plurality of complex coefficient multipliers 407*a*-407*h* (i.e., for vector modulation), a first plurality of band pass filters 410*a*-410*h* (i.e., digital passband decimation filters) respectively coupled to the first plurality of complex coefficient multipliers, and a summer 411 downstream from the first plurality of band pass filters. Further, the DSP core 406 also includes a second plurality of band pass filters 412*a*-412*h* coupled downstream from the summer 411, and a second plurality of complex coefficient multipliers 413*a*-413*h* (i.e., for vector modulation) respectively coupled downstream to the second plurality of band pass filters.

The ASIC 403 also includes a plurality of DACs 414*a*-414*h* coupled downstream from the DSP core 406 and configured to generate a plurality of analog output signals, and a feedback loop 415 coupled between the plurality of DACs and the plurality of ADCs 405*a*-405*h*. In some embodiments, the ASIC 403 may comprise a plurality of feedback loops.

The RF device 400 further comprises a processor 416 configured to control the first plurality of complex coefficient multipliers 407*a*-407*h*, the associated delay circuits 408*a*-408*d*, the second plurality of complex coefficient multipliers 413*a*-413*h*, the first plurality of band pass filters 410*a*-410*h*, and the second plurality of band pass filters. In particular, the processor 416 is configured to generate delay values for the associated delays 408*a*-408*d*, coefficients (e.g., bilinear coefficients) for the first plurality of complex coefficient multipliers 407*a*-407*h* and the second plurality of complex coefficient multipliers 413*a*-413*h*, and passband parameters for the first plurality of band pass filters 410*a*-410*h* and the second plurality of band pass filters 412*a*-412*h* (i.e., passband frequency range, center frequency of passband, passband ripple). In some embodiments, the processor 416 may be configured to transmit a digital word/bit string for the coefficients, the delay values, and the passband parameters. In some embodiments, the processor 416 may be configured to vary the coefficients, the delay values, and the passband parameters over time, or in real time/"on the fly" to respond to varying signal conditions (e.g., temporal interference). The processor 416 may be configured to selectively enable one or more of the plurality of ADCs 405*a*-405*h* and the plurality of DACs 414*a*-414*h*. In the illustrated example, the disabled ADCs 405*f*-405*h* and the disabled DACs 414*b*-414*h* are shown with cross-hatching.

One or both of the processor 416 and the feedback loop 415 may be external from the ASIC 403. Of course, in some embodiments, the processor 416 and the feedback loop 415 may be integrated with the ASIC 403. The RF device 400 illustratively includes an additional ASIC 417 coupled to the processor 416. In some embodiments, the additional ASIC 417 may comprise a replica of the ASIC 403. Of course, the additional ASIC 417 may comprise a plurality thereof in some embodiments.

Further, in the illustrated example, the processor 416 is external from the ASIC 403. The processor 416 is configured to selectively enable one or more of the plurality of ADCs 405*a*-405*h* and the plurality of DACs 414*a*-414*h*. Helpfully, this permits the RF device 400 to scale resources up and down to the needed application. In other words, the RF device 400 provides greater flexibility than typical ASIC approaches. In this embodiment, the processor 416 is coupled to the ASIC 403 via a Serializer/Deserializer (SerDes) module 420.

Another aspect is directed to an electronic device 400 comprising an IIR ASIC filter 403 to be coupled to RF circuitry 401, 402. The IIR ASIC filter 403 comprises a plurality of ADCs 405*a*-405*h* configured to generate a plurality of replica digitized input signals, a DSP core 406 downstream from the plurality of ADCs and comprising a first plurality of complex coefficient multipliers 407*a*-407*h*, a first plurality of band pass filters 410*a*-410*h* respectively coupled to the first plurality of complex coefficient multipliers, and a summer 411 downstream from the first plurality of band pass filters. The IIR ASIC filter 403 includes a plurality of DACs 414*a*-414*h* configured to generate a plurality of analog output signals, and a feedback loop 415 coupled between the plurality of DACs and the plurality of ADCs 405*a*-405*h*. The electronic device 400 also includes a processor 416 configured to control the first plurality of complex coefficient multipliers 407*a*-407*h* and associated delay circuits 408*a*-408*d*.

Yet another aspect is directed to a method for making the RF device 400 to be coupled to the RF antenna 401. The method comprises forming an ASIC 403 to be coupled downstream from the RF antenna 401 and comprising a plurality of ADCs 405*a*-405*h* configured to generate a plurality of replica digitized input signals, and a DSP core 406 downstream from the plurality of ADCs and comprising a first plurality of complex coefficient multipliers 407*a*-407*h*, a first plurality of band pass filters 410*a*-410*h* respectively coupled to the first plurality of complex coefficient multipliers, and a summer 411 downstream from the first plurality of band pass filters. The ASIC 403 also includes a plurality of DACs 414*a*-414*h* configured to generate a plurality of analog output signals, and a feedback loop 415 coupled between the plurality of DACs and the plurality of ADCs. The method further includes coupling a processor 416 to control the first plurality of complex coefficient multipliers 407*a*-407*h* and associated delay circuits 408*a*-408*d*. Advantageously, the RF device 400 may provide the plurality of waveforms transmitted by the DACs are some modified version of what came in the ADCs (i.e., either delayed or complex weighted, or superposed copies that have each undergone such modifications).

Referring again to FIGS. 4A-4B, this RF device 400 illustratively provides for a looped ASIC filter. Here, the signal is split to sample the signal on multiple ADCs 405*a*-405*h*. Each ADC 405*a*-405*h* has two fine tuners to allow frequency division multiplexing, thereby providing more taps. The beamforming is performed using both time delay blocks 408*a*-408*d* and vector modulation (i.e., typical gain/phase coefficients). Then, the signal is replayed out of the DAC 414*a*-414*h* as RF, which is sampled again in second set of ADCs, undoing frequency division multiplexing (FDM) in beamformer to sum with additional new weights and delays. The resulting I/Q Stream leaves over SerDes 420.

It should be appreciated that the RF devices 200, 300, 400 may be used in several applications, for example, predistortion for RF transmission applications, RADAR receive applications, or beamforming applications. In typical prior art approaches, the ADCs and DACs would be separate chip devices with an FPGA device therebetween.

Advantageously, as compared to the typical approaches. The number of chips is reduced, which improves SWAP. Digital filtering in ASICs may reduce workload on costly and power-hungry FPGAs later in the processing chain, avoiding up to 80% of power dissipation and 80% of the electronics cost.

The RF devices 200, 300, 400 may comprise a flexible digital filtering circuit using an arrangement of mixed-signal ASICs, which provide: variable input analog RF frequencies, bandwidths, and magnitudes; variable output analog RF frequencies, bandwidths, and magnitudes; variable input digital sample rates at baseband; and variable output digital sample rates at baseband. The RF devices 200, 300, 400 may comprise filtering implemented using: high speed ADC to DAC loopback with vector modulation; beamforming networks with complex weights and delays; and ASIC to ASIC decimation and interpolation, including analog and digital up and down conversion.

Further, typical filters may duplicate a single ADC sample and use it multiple times with differing delays and complex weights. In the RF devices 200, 300, 400, a benefit of this approach is the dynamic range benefit of dividing a signal and sampling it in multiple ADCs. By doing this, the signal ingested by each ADC may be smaller than that which would have been ingested by a single ADC, allowing for higher magnitude signals to be sampled without clipping.

Other features relating to RF devices are disclosed in co-pending application: titled "RF DEVICE WITH IIR ASIC FILTER AND RELATED METHODS,"which is incorporated herein by reference in their entirety.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

The invention claimed is:

1. A radio frequency (RF) device comprising:

an RF antenna;

an application-specific integrated circuit (ASIC) downstream from the RF antenna and comprising a plurality of analog-to-digital converters (ADCs) configured to generate a plurality of replica digitized input signals, a plurality of digital signal processing (DSP) cores downstream from the plurality of ADCs, each DSP core comprising a plurality of complex coefficient multipliers and associated delay circuits, and a respective summer downstream from each DSP core; and a processor configured to control the plurality of complex coefficient multipliers and associated delay circuits, and selectively enable one or more of the plurality of DSP cores.

2. The RF device of claim 1 wherein each DSP core comprises a plurality of band pass filters respectively coupled to the plurality of complex coefficient multipliers.

3. The RF device of claim 2 wherein the processor is configured to generate coefficients for the plurality of complex coefficient multipliers, delay values for the associated delay circuits, and passband parameters for the plurality of band pass filters.

4. The RF device of claim 1 comprising a plurality of power divider circuits external from the ASIC and coupled upstream of the plurality of ADCs and configured to generate a plurality of replica analog input signals respectively for the plurality of ADCs.

5. The RF device of claim 1 comprising at least one other ASIC coupled to the processor.

6. The RF device of claim 1 wherein the processor is external from the ASIC.

7. The RF device of claim 1 wherein the plurality of DSP cores is coupled in parallel to the plurality of ADCs.

8. The RF device of claim 1 wherein the ASIC defines a finite impulse response (FIR) filter circuit.

9. An electronic device comprising:

a finite impulse response (FIR) application-specific integrated circuit (ASIC) filter to be coupled to radio frequency (RF) circuitry and comprising a plurality of analog-to-digital converters (ADCs) configured to generate a plurality of replica digitized input signals, a plurality of digital signal processing (DSP) cores downstream from the plurality of ADCs, each DSP core comprising a plurality of complex coefficient multipliers and associated delay circuits, and a respective summer downstream from each DSP core;

a processor configured to control the plurality of complex coefficient multipliers and associated delay circuits; and a plurality of power divider circuits external from the FIR ASIC filter and coupled upstream of the plurality of ADCs and configured to generate a plurality of replica analog input signals respectively for the plurality of ADCs.

10. The electronic device of claim 9 wherein each DSP core comprises a plurality of band pass filters respectively coupled to the plurality of complex coefficient multipliers.

11. The electronic device of claim 10 wherein the processor is configured to generate coefficients for the plurality of complex coefficient multipliers, delay values for the associated delay circuits, and passband parameters for the plurality of band pass filters.

12. The electronic device of claim 9 comprising at least one other ASIC coupled to the processor.

13. The electronic device of claim 9 wherein the processor is external from the FIR ASIC filter.

14. A method for making a radio frequency (RF) device to be coupled to an RF antenna, the method comprising:

forming an application-specific integrated circuit (ASIC) to be coupled downstream from the RF antenna and comprising a plurality of analog-to-digital converters (ADCs) configured to generate a plurality of replica digitized input signals, a plurality of digital signal processing (DSP) cores downstream from the plurality of ADCs, each DSP core comprising a plurality of complex coefficient multipliers and associated delay circuits, and a respective summer downstream from each DSP core; and coupling a processor to the ASIC to control the plurality of complex coefficient multipliers and associated delay circuits, and to selectively enable one or more of the plurality of DSP cores.

15. The method of claim 14 wherein each DSP core comprises a plurality of band pass filters respectively coupled to the plurality of complex coefficient multipliers; and wherein the processor is configured to generate coefficients for the plurality of complex coefficient multipliers, delay values for the associated delay circuits, and passband parameters for the plurality of band pass filters.

16. The method of claim 14 comprising coupling a plurality of power divider circuits external from the ASIC and upstream of the plurality of ADCs and configured to generate a plurality of replica analog input signals respectively for the plurality of ADCs.

17. An electronic device comprising:

a finite impulse response (FIR) application-specific integrated circuit (ASIC) filter to be coupled to radio frequency (RF) circuitry and comprising a plurality of analog-to-digital converters (ADCs) configured to generate a plurality of replica digitized input signals, a plurality of digital signal processing (DSP) cores downstream from the plurality of ADCs, each DSP core comprising a plurality of complex coefficient multipliers and associated delay circuits, and a respective summer downstream from each DSP core; and a processor configured to control the plurality of complex coefficient multipliers and associated delay circuits, and selectively enable one or more of the plurality of DSP cores.

18. The electronic device of claim 17 wherein each DSP core comprises a plurality of band pass filters respectively coupled to the plurality of complex coefficient multipliers.

19. The electronic device of claim 18 wherein the processor is configured to generate coefficients for the plurality of complex coefficient multipliers, delay values for the associated delay circuits, and passband parameters for the plurality of band pass filters.

20. An electronic device comprising:

a finite impulse response (FIR) application-specific integrated circuit (ASIC) filter to be coupled to radio frequency (RF) circuitry and comprising a plurality of analog-to-digital converters (ADCs) configured to generate a plurality of replica digitized input signals, a plurality of digital signal processing (DSP) cores downstream from the plurality of ADCs and coupled in parallel to the plurality of ADCs, each DSP core comprising a plurality of complex coefficient multipliers and associated delay circuits, and a respective summer downstream from each DSP core; and a processor configured to control the plurality of complex coefficient multipliers and associated delay circuits, and selectively enable one or more of the plurality of DSP cores.

21. The electronic device of claim 20 wherein each DSP core comprises a plurality of band pass filters respectively coupled to the plurality of complex coefficient multipliers.

22. The electronic device of claim 21 wherein the processor is configured to generate coefficients for the plurality of complex coefficient multipliers, delay values for the associated delay circuits, and passband parameters for the plurality of band pass filters.

* * * * *